(12) United States Patent
Ono et al.

(10) Patent No.: US 7,327,991 B2
(45) Date of Patent: Feb. 5, 2008

(54) PULSE MODULATION CIRCUIT

(75) Inventors: Masayoshi Ono, Tokyo (JP); Kenji Kawakami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 386 days.

(21) Appl. No.: 10/979,114

(22) Filed: Nov. 3, 2004

(65) Prior Publication Data
US 2006/0014504 A1  Jan. 19, 2006

(30) Foreign Application Priority Data
Jul. 16, 2004  (JP) ............................. 2004-210311

(51) Int. Cl.
*H04B 1/04* (2006.01)
(52) U.S. Cl. ...................... 455/112; 455/118; 375/238; 375/302
(58) Field of Classification Search ............. 455/114.1, 455/114.2, 98, 118, 102, 120, 124, 323, 293, 455/110, 112; 342/203, 204; 375/238, 239, 375/268, 302
See application file for complete search history.

(56) References Cited

U.S. PATENT DOCUMENTS

| | | | | |
|---|---|---|---|---|
| 5,508,617 A | * | 4/1996 | Komatsu | 324/379 |
| 5,603,114 A | * | 2/1997 | Tomita | 455/249.1 |
| 6,037,895 A | * | 3/2000 | Uehara | 342/70 |
| 6,091,940 A | * | 7/2000 | Sorrells et al. | 455/118 |
| 6,362,777 B1 | * | 3/2002 | Kawakami et al. | 342/131 |
| 6,804,497 B2 | * | 10/2004 | Kerth et al. | 455/88 |
| 6,922,552 B2 | * | 7/2005 | Noori | 455/114.3 |
| 2004/0087297 A1 | * | 5/2004 | Ash | 455/290 |
| 2004/0087397 A1 | * | 5/2004 | Campagnolo et al. | 474/81 |
| 2004/0198259 A1 | * | 10/2004 | Kim et al. | 455/114.1 |
| 2005/0031021 A1 | * | 2/2005 | Baker et al. | 375/142 |
| 2005/0191985 A1 | * | 9/2005 | Bos et al. | 455/326 |
| 2006/0148440 A1 | * | 7/2006 | Bargroff | 455/323 |

FOREIGN PATENT DOCUMENTS

JP  63142923 A  *  6/1988
JP  6-138217 A     5/1994

* cited by examiner

*Primary Examiner*—Quochien B. Vuong
(74) *Attorney, Agent, or Firm*—Sughrue Mion, PLLC

(57) ABSTRACT

Provided is a pulse modulation circuit that improves the on/off operation and improves the on/off ratio of an output power of the entire pulse modulation circuit in the switching operation. The pulse modulation circuit inputs a local oscillation wave and a DC pulse signal, mixes a second harmonic wave of the local oscillation wave with the DC pulse signal, and outputs an RF pulse signal. The pulse modulation circuit includes: a switch that inputs the local oscillation wave and attenuates the local oscillation wave at an off time more than at an on time; and a harmonic mixer that inputs the local oscillation wave affected by the switch and the DC pulse signal, mixes the second harmonic wave of the local oscillation wave with the DC pulse signal, and outputs the RF pulse signal, in which the switch is allowed to conduct the switching operation together with the harmonic mixer according to the DC pulse signal.

16 Claims, 6 Drawing Sheets

F I G. 5
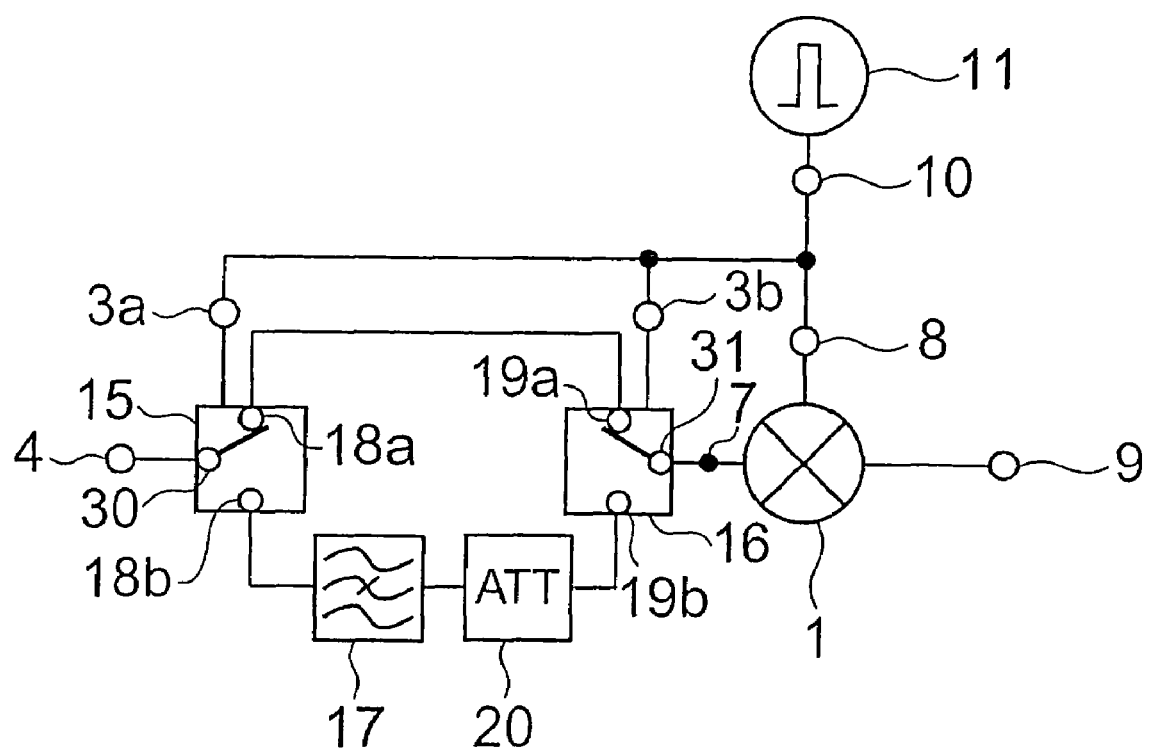

PULSE MODULATION CIRCUIT

BACKGROUND OF THE INVENTION

1. Field of the Invention

The present invention relates to a pulse modulation circuit, and more particularly to a pulse modulation circuit used for communication or radar.

2. Description of the Related Art

Up to now, modulation circuits, which include a harmonic mixer, are used in a Pulse-Doppler radar apparatus for a vehicle or the like (for example, refer to JP 2000-338233 A).

In the pulse modulation circuit disclosed in JP 2000-338233 A, the harmonic mixer is equipped with a harmonic mixer local oscillation (LO) signal input terminal for inputting an LO wave, and a harmonic mixer IF signal input terminal for inputting the IF signal that is generated by the pulse signal generator as well as an RF signal output terminal for outputting the RF signal into which the inputted LO wave and IF signal are mixed.

The operation will be described. The harmonic mixer inputs the LO wave to the harmonic mixer LO signal input terminal, inputs the IF signal to the harmonic mixer IF signal input terminal and mixes those signals together to output a sum frequency component of the second harmonic wave of the LO wave and the IF signal to the RF signal output terminal 9. A relation of $f_{RF}=2f_{LO}+f_{IF}$ is satisfied assuming that $f_{LO}$ is the LO frequency, $f_{IF}$ is the IF frequency and $f_{RF}$ is the RF frequency.

In the case where the dc component is inputted to the harmonic mixer IF signal input terminal as the IF signal, when a supply voltage of dc is 0, the second harmonic wave component of the LO wave is not outputted to the RF signal output terminal because there is no IF signal that is mixed with the LO wave. In the case of a supply voltage V1 (an arbitrary voltage other than 0) of dc, the LO wave and the dc component are mixed together, to thereby satisfy $f_{RF}=2f_{LO}$ because of $f_{IF}=0$, and the second harmonic wave component of the LO wave is outputted to the RF signal output terminal.

In the case where a DC pulse that has been generated in the pulse signal generator is supplied to the harmonic mixer IF signal input terminal, and the LO wave is supplied from the harmonic mixer LO signal input terminal, the LO wave is mixed with the DC pulse that has been supplied to the harmonic mixer IF signal input terminal in the harmonic mixer, and a mixed wave of the second harmonic wave of the LO frequency which is a higher harmonic wave of an odd order and the DC pulse signal is outputted from the RF signal output terminal 9 as a modulated wave.

In the case of the conventional pulse modulation circuit as described above, the second harmonic component of the LO wave should not theoretically be outputted at the supply voltage at the off time of the pulse. However, at the actual supply voltage at the off time of the pulse, there arises such a problem that the on/off ratio of the output power in the switching operation is reduced due to noises of several tens mV which is close to 0 V.

In addition, there arises such a problem that the on/off ratio is deteriorated due to manufacture variations of elements (for example, diodes) which structure the harmonic mixer.

SUMMARY OF THE INVENTION

The present invention has been made to solve the above problems, and it is an object of the present invention to provide a pulse modulation circuit that improves the on/off operation and improves the on/off ratio of an output power of the entire pulse modulation circuit in the switching operation.

The present invention provides a pulse modulation circuit that inputs a local oscillation wave and a DC pulse signal, mixes a second harmonic wave of the local oscillation wave with the DC pulse signal, and out puts an RF pulse signal. The pulse modulation circuit includes a switch that inputs the local oscillation wave and attenuates the local oscillation wave at an off time more than at an on time. The pulse modulation circuit also includes a harmonic mixer that inputs the local oscillation wave affected by the switch and the DC pulse signal, mixes the second harmonic wave of the local oscillation wave with the DC pulse signal, and outputs the RF pulse signal, wherein the switch is allowed to conduct a switching operation together with the harmonic mixer according to the DC pulse signal.

With this structure, since the on/off ratio is adjusted by the switch, and an on/off ratio of the harmonic mixer per se can be added to the adjusted on/off ratio, the on/off operation in the switching operation can be improved, and the on/off ratio of the output power as the entire pulse modulation circuit can be improved.

BRIEF DESCRIPTION OF THE DRAWINGS

In the accompanying drawings:

FIG. 5 is a structural diagram showing the structure of a pulse modulation circuit in accordance with a fifth embodiment of the present invention.

DETAILED DESCRIPTION OF THE PREFERRED EMBODIMENTS

Now, a description will be given in more detail of preferred embodiments of the present invention with reference to the accompanying drawings.

First Embodiment

Figure 1:
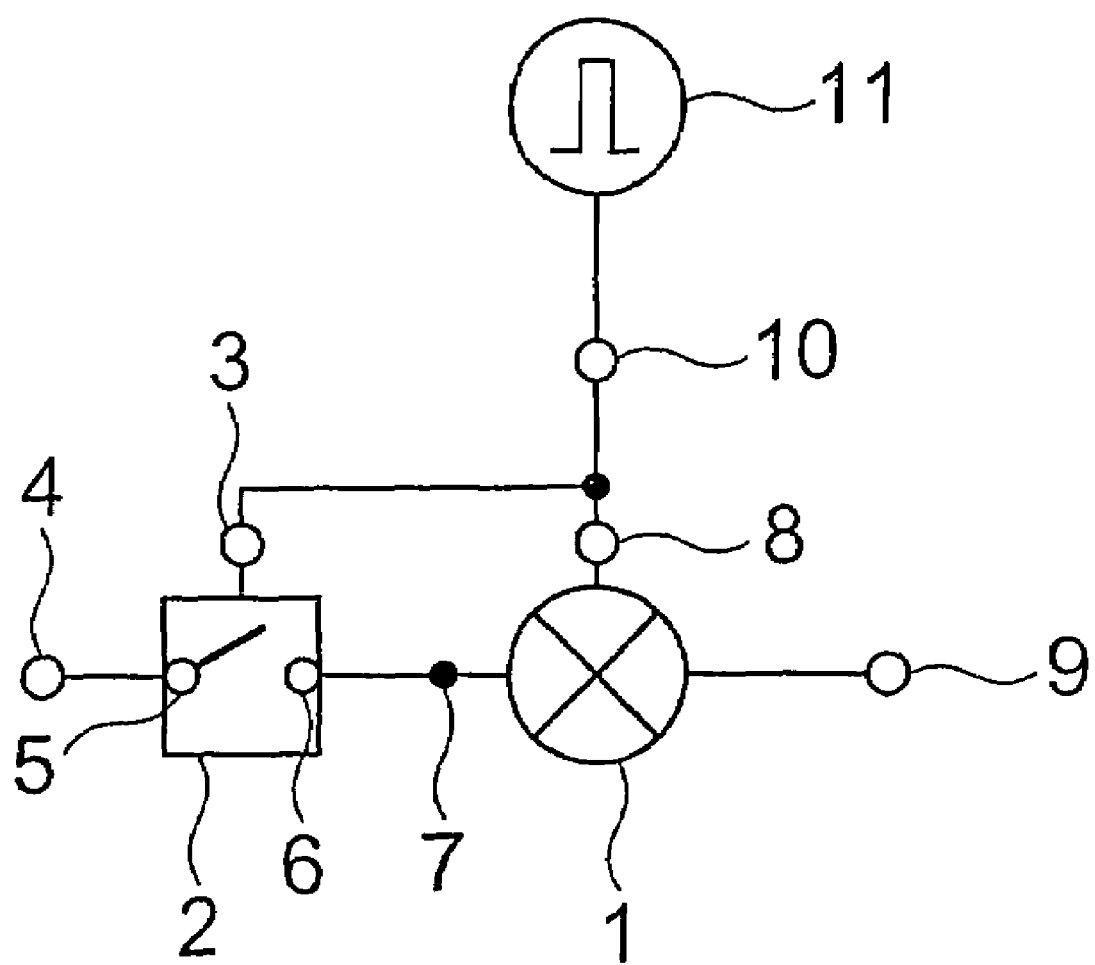
FIG. 1 is a structural diagram showing the structure of a pulse modulation circuit in accordance with a first embodiment of the present invention.

FIG. 1 shows the structure of a pulse modulation circuit in accordance with a first embodiment of the present invention. The pulse modulation circuit according to the present invention is a pulse modulation circuit using a harmonic mixer 1 that inputs an LO signal (local oscillation wave) and a DC pulse, mixes the second harmonic wave of the LO signal with the DC pulse, and outputs an RF pulse signal. The harmonic mixer 1 inputs the LO signal to a harmonic mixer LO signal input terminal 7, inputs a DC pulse signal to a harmonic mixer IF signal input terminal 8, mixes those inputted signals together, and outputs a sum frequency component of the second harmonic wave of the LO signal and the DC pulse signal to an RF signal output terminal 9. It is assumed that the frequency of the LO signal is $f_{LO}$, the frequency of the DC pulse signal is $f_{IF}$, and the frequency of the RF signal is $f_{RF}$, a relation of $f_{RF}=2f_{LO}+f_{IF}$ is established.

As shown in FIG. 1, the pulse modulation circuit according to this embodiment is made up of the harmonic mixer 1, a single pole single throw (SPST) switch 2, and a pulse signal generator 11. In this embodiment, the SPST switch 2 is connected in series to a fore stage of the harmonic mixer 1, and the LO signal is inputted to the harmonic mixer 1 through the SPST switch 2. That is, an LO signal input terminal 4 for applying the LO signal is connected to an SPST switch input terminal 5 that is disposed in the SPST switch 2, and an SPST switch output terminal 6 that is disposed in the SPST switch 2 is connected to the harmonic mixer 1 through the harmonic mixer LO signal input terminal 7. Also, a pulse signal supply terminal 10 that is connected to the pulse signal generator 11 is connected to the SPST switch 2 through the switch pulse input terminal 3 and also connected to the harmonic mixer 1 through the harmonic mixer IF signal input terminal 8. As a result, the SPST switch 2 and the harmonic mixer 1 can conduct the switching operation at the same time according to the DC pulse that is generated from the pulse signal generator 11. With this structure, the LO signal that is inputted through the harmonic mixer LO signal input terminal 7 and the DC pulse that is inputted through the harmonic mixer IF signal input terminal 8 are mixed together in the harmonic mixer 1, and then outputted from the RF signal output terminal 9 that is connected to the harmonic mixer 1.

The operation will be described below. The DC pulse that is generated by the pulse signal generator 11 is supplied to the pulse signal supply terminal 10, and the LO signal is supplied to the LO signal input terminal 4. At the pulse-on time, the DC pulse that has been supplied to the pulse signal supply terminal 10 is supplied to the SPST switch 2 from the switch pulse input terminal 3. As a result, the SPST switch 2 becomes in an on state, and the LO signal that has been supplied from the LO signal input terminal 4 to the SPST switch input terminal 5 is attenuated by an insertion loss amount of the SPST switch 2, and then supplied to the harmonic mixer LO signal input terminal 7 through the SPST switch output terminal 6. On the other hand, at the pulse-off time, the DC pulse that has been supplied to the pulse signal supply terminal 10 is supplied to the SPST switch 2 by the switch pulse input terminal 3. As a result, the SPST switch 2 becomes in an off state, and the LO signal that has been supplied from the LO signal input terminal 4 to the SPST switch input terminal 5 is attenuated by an isolation amount of the SPST switch 2, and then supplied to the harmonic mixer LO signal input terminal 7 through the SPST switch output terminal 6. In this way, at the respective pulse-on time and pulse-off time, the LO signal that has been supplied to the harmonic mixer LO signal input terminal 7 is inputted to the harmonic mixer 1. In this situation, the DC pulse that has been supplied to the pulse signal supply terminal 10 is inputted to the harmonic mixer 1 through the harmonic mixer IF signal input terminal 8. As a result, the LO signal and the DC pulse are mixed together in the harmonic mixer 1, and a mixed wave of the second harmonic wave of the LO frequency which is the higher harmonic wave of an odd order and the DC pulse signal is outputted from the RF signal output terminal 9 as the modulated wave. In this situation, the ratio of the output power at the pulse-on time to the output power at the pulse-off time in the RF signal output terminal 9 becomes an on/off ratio.

The on/off ratio of the single SPST switch 2 that is disposed at the fore stage of the harmonic mixer 1 becomes a ratio of the insertion loss (pulse-on time) of the above-mentioned SPST switch 2 to the isolation (pulse-off time). As described above, since an output frequency of the harmonic mixer 1 is twice of an input frequency, a change of the output signal to the input signal of the harmonic mixer 1 becomes 1:2. That is, the on/off ratio of the added SPST switch 2 becomes ideally twice the on/off ratio in the output terminal of the harmonic mixer 1, and further is added with the on/off ratio of the harmonic mixer 1 per se, thereby making it possible to increase the on/off ratio of the entire pulse modulation circuit by a factor of two or more.

As described above, according to this embodiment, in the pulse modulation circuit having the harmonic mixer 1 that inputs the LO signal that is the local oscillation wave and the DC pulse signal, mixes the second harmonic wave of the LO signal and the DC pulse signal together, and outputs the RF pulse signal, the SPST switch 2 is connected in series to the fore stage of the harmonic mixer 1, and conducts the switching operation together with the harmonic mixer 1 according to the DC pulse signal, to thereby improve the on/off operation. In addition, since the output frequency of the harmonic mixer 1 is twice of the input frequency, a change of the output signal to the input signal of the harmonic mixer 1 becomes 1:2. Therefore, the on/off ratio of the added SPST switch 2 becomes ideally twice the on/off ratio in the output terminal of the harmonic mixer 1, and is further added with the on/off ratio of the harmonic mixer 1 per se, thereby making it possible to improve the on/off ratio of the entire pulse modulation circuit.

Second Embodiment

Figure 2:
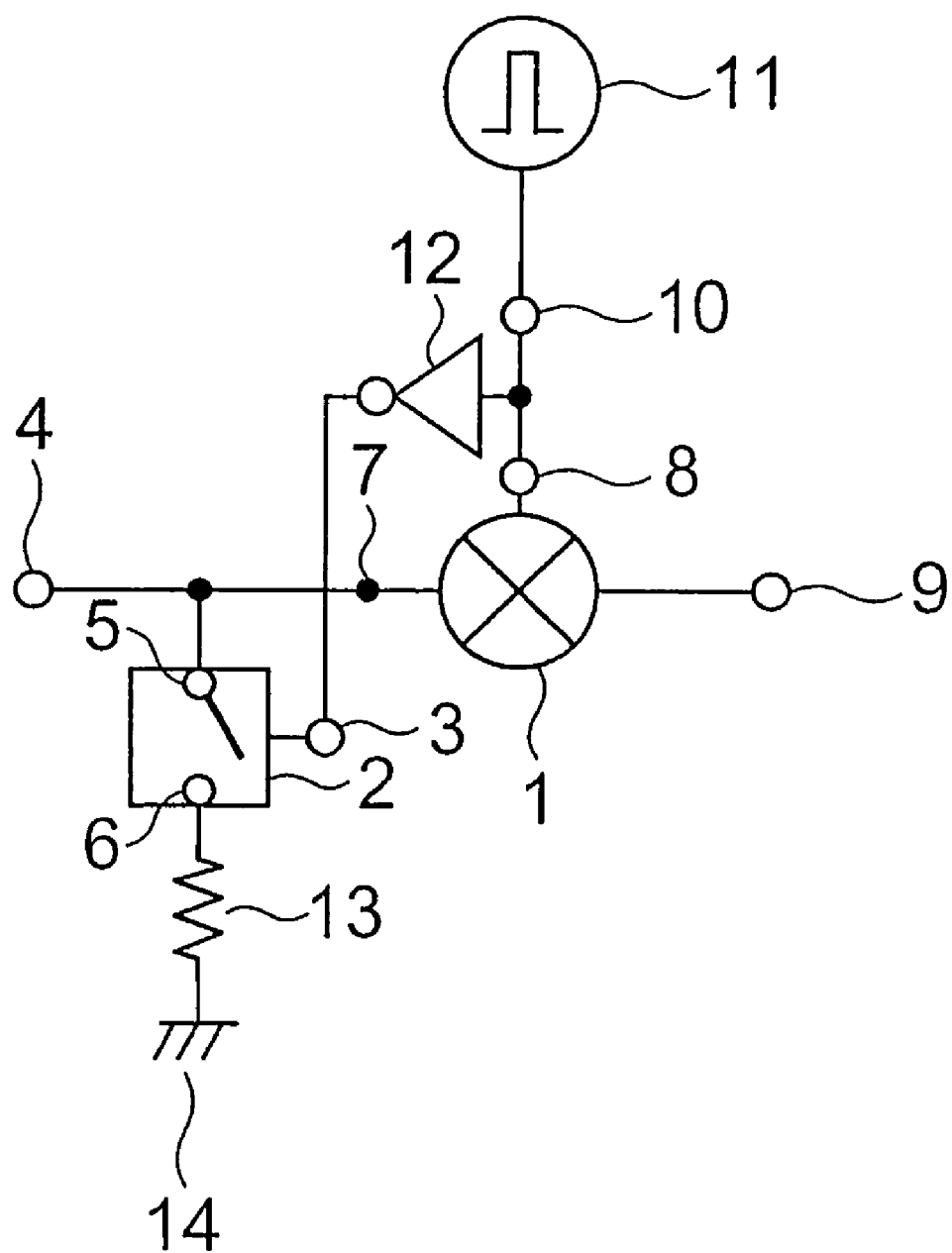
FIG. 2 is a structural diagram showing the structure of a pulse modulation circuit in accordance with a second embodiment of the present invention.

FIG. 2 shows the structure of a pulse modulation circuit in accordance with a second embodiment of the present invention. As shown in FIG. 2, the pulse modulation circuit according to this embodiment includes a harmonic mixer 1, a single pole single throw (SPST) switch 2, and a pulse signal generator 11, as in the structure shown in FIG. 1. In this embodiment, the SPST switch 2 is connected in parallel with the fore stage of the harmonic mixer 1. That is, an LO signal input terminal 4 for applying the LO signal is connected to an SPST switch input terminal 5 that is disposed in the SPST switch 2, and an SPST switch output terminal 6 that is disposed in the SPST switch 2 is grounded to a grounding point 14 through a terminating resistor 13. Also, a harmonic mixer LO signal input terminal 7 is disposed between the SPST switch 2 and the harmonic mixer 1. A pulse signal supply terminal 10 that is connected to a pulse signal generator 11 is connected to the SPST switch 2 through an inverter 12 and the switch pulse input terminal 3, and also connected to the harmonic mixer 1 through a harmonic mixer IF signal input terminal 8. As a result, the SPST switch 2 and the harmonic mixer 1 can conduct the switching operation at the same time according to the DC pulse that is generated from the pulse signal generator 11. With the structure, the LO signal that is inputted through the harmonic mixer LO signal input terminal 7 and the DC pulse that is inputted through the harmonic mixer IF signal input terminal 8 are mixed together in the harmonic mixer 1, and then outputted from the RF signal output terminal 9 that is connected to the harmonic mixer 1.

Then, the operation will be described below. The DC pulse that has been generated by the pulse signal generator 11 is supplied to the pulse signal supply terminal 10, and the LO signal is supplied from the LO signal input terminal 4.

At the pulse-on time, since the DC pulse that has been supplied to the pulse signal supply terminal 10 is inversed by the inverter 12 and then supplied to the SPST switch 2 through the switch pulse input terminal 3, the SPST switch 2 becomes in an off state. In this case, because the SPST switch 2 is viewed as an open end from the LO signal input terminal 4, the LO signal is attenuated by the insertion loss amount that is derived from a parasitic element such as an off capacity of the SPST switch 2, and then supplied to the harmonic mixer LO signal input terminal 7. At the pulse-off time, since the DC pulse that has been supplied to the pulse signal supply terminal 10 is inversed by the inverter 12 and then supplied to the SPST switch 2 through the switch pulse input terminal 3, the SPST switch 2 becomes in the on state. In this case, because the SPST switch 2 is viewed from the LO signal input terminal 4 as a resistor circuit that is grounded to the grounding point 14 through the terminating resistor 13, most of the LO signal is transmitted to the grounding point 14 after passing through the SPST switch 2. A part of the LO signal that did not pass through the grounding point 14 is supplied to the harmonic mixer LO signal input terminal 7. In this manner, in the respective pulse-on time and pulse-off time, the LO signal that has been supplied to the harmonic mixer LO signal input terminal 7 is mixed with the DC pulse that has been supplied to the pulse signal supply terminal 10 in the harmonic mixer 1, and the mixed wave of the second harmonic wave of the LO frequency which is the higher harmonic wave of an odd order and the DC pulse signal is outputted from the RF signal output terminal 9 as the modulated wave.

The on/off ratio of the SPST switch 2 that is disposed in parallel with the fore stage of the harmonic mixer 1 becomes a ratio of the insertion loss (pulse-on time) of the above-mentioned SPST switch 2 to the isolation (pulse-off time). Similarly to the first embodiment, since an output frequency of the harmonic mixer 1 is twice of an input frequency, a change of the output signal to the input signal of the harmonic mixer 1 becomes 1:2. That is, the on/off ratio of the added SPST switch 2 disposed in parallel becomes ideally twice the on/off ratio in the output terminal of the harmonic mixer 1, and further is added with the on/off ratio of the harmonic mixer 1 per se, thereby making it possible to increase the on/off ratio of the entire pulse modulation circuit by a factor of two or more.

As described above, according to this embodiment, in the pulse modulation circuit having the harmonic mixer 1 that inputs the LO signal that is the local oscillation wave and the DC pulse signal, mixes the second harmonic wave of the LO signal and the DC pulse signal together, and outputs the RF pulse signal, the SPST switch 2 is connected in parallel to the fore stage of the harmonic mixer 1, and conducts the switching operation together with the harmonic mixer 1 according to the DC pulse signal, to thereby improve the on/off operation. In addition, since the output frequency of the harmonic mixer 1 is twice of the input frequency, a change of the output signal to the input signal of the harmonic mixer 1 becomes 1:2. Therefore, the on/off ratio of the added SPST switch 2 becomes ideally twice the on/off ratio in the output terminal of the harmonic mixer 1, and is further added with the on/off ratio of the harmonic mixer 1 per se, thereby making it possible to improve the on/off ratio of the entire pulse modulation circuit.

Third Embodiment

Figure 3:
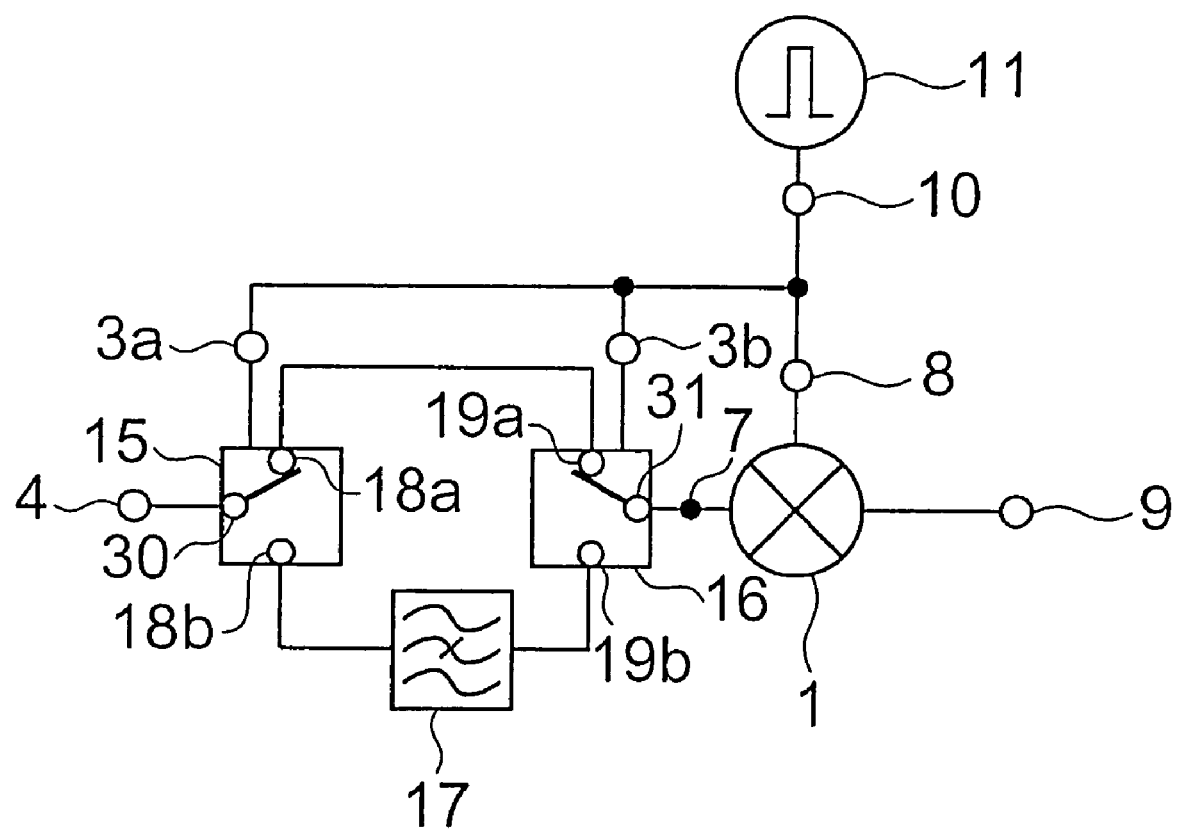
FIG. 3 is a structural diagram showing the structure of a pulse modulation circuit in accordance with a third embodiment of the present invention.

FIG. 3 shows the structure of a pulse modulation circuit in accordance with a third embodiment of the present invention. As shown in FIG. 3, the pulse modulation circuit according to this embodiment includes a harmonic mixer 1, a single pole double throw (SPDT) switch A15, an SPDT switch B16, a band rejection filter 17 (hereinafter referred to as BRF 17"), and a pulse signal generator 11. In this embodiment, the SPDT switch A15, the SPDT switch B16, and the BRF17 constitute a switching circuit (switch). The switching circuit is connected in series to the fore stage of the harmonic mixer 1, and the LO signal is inputted to the harmonic mixer 1 through the switching circuit. That is, an LO signal input terminal 4 for supplying the LO signal is connected to an input terminal 30 that is disposed in the SPDT switch A15, and an output terminal 31 that is disposed in the SPDT switch B16 is connected to the harmonic mixer 1 through the harmonic mixer LO signal input terminal 7. In addition, a pulse signal supply terminal 10 that is connected to the pulse signal generator 11 is connected to the SPDT switch A15 and the SPDT switch B16 through switch pulse input terminals 3a and 3b, and also connected to the harmonic mixer 1 through the harmonic mixer IF signal input terminal 8. As a result, the DC pulse that is generated from the pulse signal generator 11 allows the SPDT switch A15, the SPDT switch B16, and the harmonic mixer 1 to conduct the switching operation at the same time. With this structure, the LO signal that is inputted through the harmonic mixer LO signal input terminal 7 and the DC pulse that is inputted through the harmonic mixer IF signal input terminal 8 are mixed together in the harmonic mixer 1, and then outputted from the RF signal output terminal 9 that is connected to the harmonic mixer 1.

As described above, in this embodiment, as shown in FIG. 3, the switching circuit (switch) that is made up of the SPDT switch A15 having one input and two outputs, the SPDT switch B16 having two inputs and one output, and the BRF 17 is disposed at the fore stage of the harmonic mixer 1 instead of the SPST switch 2 of the first embodiment. An SPDT switch A output terminal 18a that is one output terminal of the SPDT switch A15 and an SPDT switch B input terminal 19a that is one input terminal of the SPDT switch B16 are connected in series to each other. However, an SPDT switch A output terminal 18b that is the other output terminal of the SPDT switch A15 and an SPDT switch B input terminal 19b that is the other input terminal of the SPDT switch B16 are connected to each other through the BRF 17 (band rejection filter) having the LO frequency as a resonance frequency. At the pulse-on time, the output of the SPDT switch A15 becomes the SPDT switch A output terminal 18a, and the input of the SPDT switch B16 becomes the SPDT switch B input terminal 19a. At the pulse-off time, the output of the SPDT switch A15 becomes the SPDT switch A output terminal 18b, and the input of the SPDT switch B16 becomes the SPDT switch B input terminal 19b. In this manner, the SPDT switch A15 and the SPDT switch B16 structure the switching circuit (switch) that changes over according to the DC pulse. In this embodiment, the BRF 17 structures an attenuation means for attenuating the LO signal.

Then, the operation will be described below. The DC pulse that has been generated by the pulse signal generator 11 is supplied to the pulse signal supply terminal 10, and the LO signal is supplied from the LO signal input terminal 4. At the pulse-on time, the DC pulse that has been supplied to the pulse signal supply terminal 10 is supplied to the SPDT switch A15 and the SPDT switch B16 through the switch pulse input terminals 3a and 3b. As a result, the output of the SPDT switch A15 becomes the SPDT switch A output terminal 18a, and the input of the SPDT switch B16 becomes the SPDT switch B input terminal 19*a*. At this time, the LO signal that has been supplied from the LO signal input terminal 4 is transmitted through a path of the SPDT switch A15, the SPDT switch A output terminal 18*a*, the SPDT switch B input terminal 19*a*, and the SPDT switch B16, and then supplied to the harmonic mixer LO signal input terminal 7 of the harmonic mixer 1. The LO signal that has been supplied to the harmonic mixer LO signal input terminal 7 and the DC pulse that is supplied to the harmonic mixer IF signal input terminal 8 are mixed together in the harmonic mixer 1, and a mixed wave of the second harmonic wave of the LO frequency and the DC pulse signal is outputted from the RF signal output terminal 9 as the modulated wave.

At the pulse-off time, the DC pulse that has been supplied to the pulse signal supply terminal 10 is supplied to the SPDT switch A15 and the SPDT switch B16 through the switch pulse input terminals 3*a* and 3*b*. As a result, the output of the SPDT switch A15 becomes the SPDT switch A output terminal 18*b*, and the input of the SPDT switch B16 becomes the SPDT switch B input terminal 19*b*. The LO signal that has been supplied from the LO signal input terminal 4 is transmitted through a path of the SPDT switch A15, the SPDT switch A output terminal 18*b*, the BRF 17, the SPDT switch B input terminal 19*b*, and the SPDT switch B16, and then supplied to the harmonic mixer LO signal input terminal 7 of the harmonic mixer 1. In this situation, the LO signal is largely attenuated by the BRF 17. The LO signal that has been supplied to the harmonic mixer LO signal input terminal 7 and the DC pulse that is supplied to the harmonic mixer IF signal input terminal 8 are mixed together in the harmonic mixer 1 similarly to in the pulse-on time, and a mixed wave of the second harmonic wave of the LO frequency and the DC pulse signal is outputted from the RF signal output terminal 9 as the modulated wave.

In this situation, the switching circuit having one connection between the SPDT switch A15 with one input and two outputs and the SPDT switch B16 with two inputs and one output which connects directly between the switches 15 and 16 and the other connection between the switches 15 and 16 which connects between the switches 15 and 16 through BRF 17 having the LO frequency as the resonance frequency is disposed between the SPDT switch A15 and the SPDT switch B16 as the switching circuit disposed at the fore stage of the harmonic mixer 1. Therefore, the on/off ratio becomes a ratio of the output power to the harmonic mixer LO signal input terminal 7 in the case where the switching circuit switches according to the DC pulse. The output power level at the pulse-off time is determined according to a suppression ratio at the LO frequency of the BRF 17, and the on/off ratio of the switching circuit increases as the suppression ratio increases. Similarly to the first embodiment, since the output frequency of the harmonic mixer 1 is twice of the input frequency, a change of the output signal to the input signal of the harmonic mixer 1 becomes 1:2. That is, the on/off ratio of the switching circuit including the added BRF 17 becomes ideally twice the on/off ratio at the harmonic mixer output terminal, and is added with the on/off ratio of the harmonic mixer per se, thereby making it possible to improve the on/off ratio of the entire pulse modulation circuit.

As described above, in this embodiment, in the pulse modulation circuit using the harmonic mixer 1 that mixes the second harmonic wave of the LO signal that is the local oscillation wave and the DC pulse signal together and outputs the RF pulse signal, the switching circuit (switch) that is made up of the two SPDT switches 15 and 16 is connected in series to the fore stage of the harmonic mixer 1. That is, in the switching circuit, one of between the SPDT switches 15 and 16 is connected directly and the other of between the switches 15 and 16 is connected through the BRF 17 that is the band rejection filter having the local oscillation frequency as the resonance frequency so that the switching circuit switches at the pulse-on time and pulse-off time. In this structure, the switching circuit and the harmonic mixer 1 are allowed to conduct the switching operation at the same time according to the DC pulse signal, thereby improving the on/off operation. Also, since the output frequency of the harmonic mixer 1 is twice of the input frequency, a change of the output signal to the input signal of the harmonic mixer 1 is 1:2. That is, the on/off ratio of the switching circuit including the added BRF 17 becomes ideally twice the on/off ratio at the harmonic output terminal, and is then added with the on/off ratio of the harmonic mixer 1 per se, thereby making it possible to improve the on/off ratio of the entire pulse modulation circuit.

Fourth Embodiment

Figure 4:
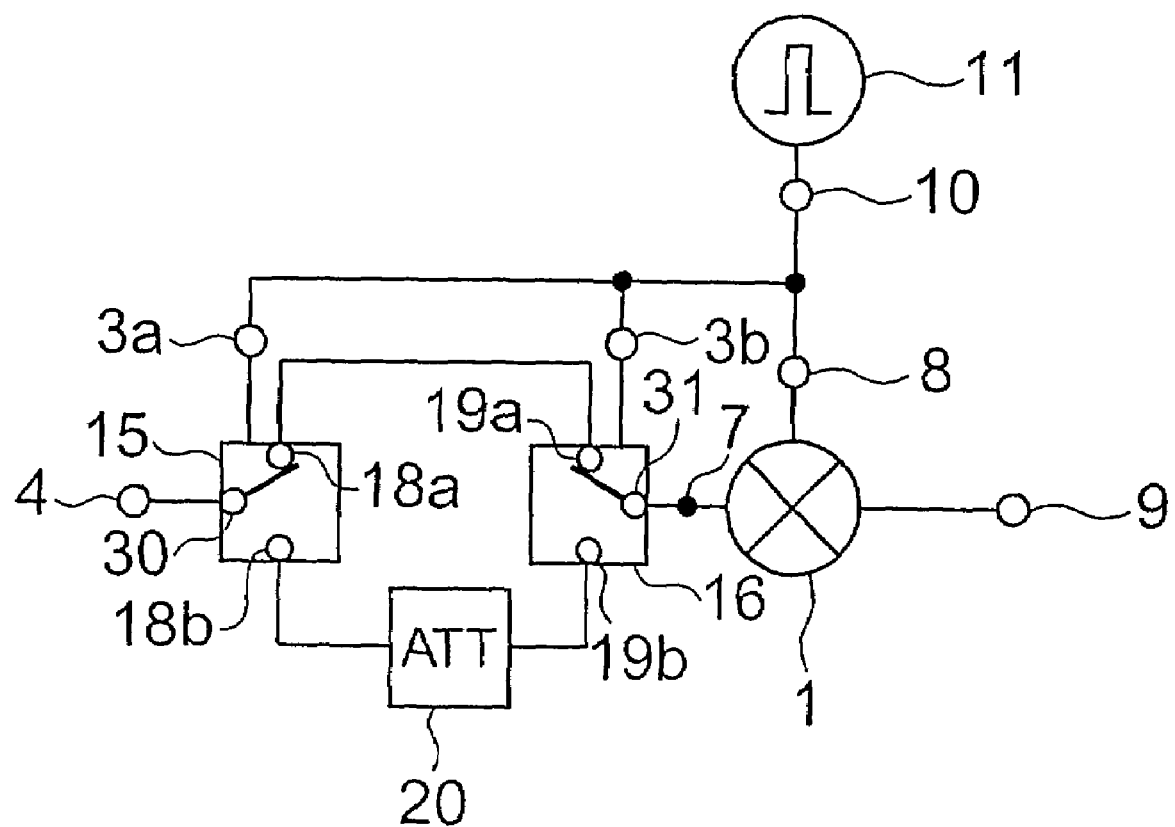
FIG. 4 is a structural diagram showing the structure of a pulse modulation circuit in accordance with a fourth embodiment of the present invention.

FIG. 4 shows the structure of a pulse modulation circuit in accordance with a fourth embodiment of the present invention. As shown in FIG. 4, the pulse modulation circuit according to this embodiment is made up of a harmonic mixer 1, switch pulse input terminals 3*a*, 3*b*, an LO signal input terminal 4, a harmonic mixer LO signal input terminal 7, a harmonic mixer IF signal input terminal 8, an RF signal output terminal 9, a pulse signal supply terminal 10, a pulse signal generator 11, an SPDT switch A15, an SPDT switch B16, SPDT switch A output terminals 18*a*, 18*b*, SPDT switch B input terminals 19*a*, 19*b*, and an attenuator 20 (fixed attenuator).

The structure of FIG. 4 is a structure in which the BRF 17 of the above third embodiment is replaced with the attenuator 20. Because the basic operation and structure are identical with those of the third embodiment, the detailed description will be omitted while the same parts are indicated by symbols identical with those in FIG. 3.

In this embodiment, the on/off ratio of the switching circuit (switch) at the fore stage of the harmonic mixer 1 is determined according to the attenuation amount of the attenuator 20, and the on/off ratio increases as the attenuation amount increases. That is, in this embodiment, the attenuator 20 structures an attenuation means for attenuating the LO signal. As in the first embodiment, since the output frequency of the harmonic mixer 1 is twice of the input frequency, a change in the output signal to the input signal of the harmonic mixer 1 becomes 1:2. That is, the on/off ratio of the switching circuit including the added attenuator 20 becomes ideally twice the on/off ratio at the harmonic mixer output terminal, and is added with the on/off ratio of the harmonic mixer per se, thereby making it possible to improve the on/off ratio of the entire pulse modulation circuit.

As described above, in this embodiment, in the pulse modulation circuit using the harmonic mixer 1 that mixes the second harmonic wave of the LO signal that is the local oscillation wave and the DC pulse signal together and outputs the RF pulse signal, the switching circuit (switch) that is made up of the two SPDT switches 15 and 16 is connected in series to the fore stage of the harmonic mixer 1. That is, in the switching circuit, one of between the SPDT switches 15 and 16 is connected directly and the other is connected through the attenuator 20. In this structure, the switching circuit and the harmonic mixer 1 are allowed to conduct the switching operation at the same time according to the DC pulse signal, thereby improving the on/off operation. Also, since the output frequency of the harmonic mixer 1 is twice of the input frequency, a change of the output signal to the input signal of the harmonic mixer 1 is 1:2. That is, the on/off ratio of the switching circuit including the added attenuator 20 becomes ideally twice the on/off ratio at the harmonic output terminal, and is then added with the on/off ratio of the harmonic mixer 1 per se, thereby making it possible to improve the on/off ratio of the entire pulse modulation circuit.

Fifth Embodiment

FIG. 5 shows the structure of a pulse modulation circuit in accordance with a fifth embodiment of the present invention. As shown in FIG. 5, the pulse modulation circuit according to this embodiment is made up of a harmonic mixer 1, switch pulse input terminals 3a, 3b, an LO signal input terminal 4, a harmonic mixer LO signal input terminal 7, a harmonic mixer IF signal input terminal 8, an RF signal output terminal 9, a pulse signal supply terminal 10, a pulse signal generator 11, an SPDT switch A15, an SPDT switch B16, a BRF 17, SPDT switch A output terminals 18a, 18b, SPDT switch B input terminals 19a, 19b, and an attenuator 20 (fixed attenuator).

The structure of FIG. 5 is a structure in which the attenuator 20 that is connected in series to the BRF 17 of the above third embodiment is further inserted. Because the basic structure and operation are identical with those of the third embodiment, the detailed description will be omitted while the same parts are indicated by symbols identical with those in FIG. 3.

In this embodiment, the on/off ratio of the switching circuit (switch) at the fore stage of the harmonic mixer 1 is determined according to the suppression ratio of the BRF 17 and the attenuation amount of the attenuator 20, and the on/off ratio increases as the suppression ratio and the attenuation amount increase. In this embodiment, the BRF 17 and the attenuator 20 structure an attenuation means for attenuating the LO signal. As in the first embodiment, since the output frequency of the harmonic mixer 1 is twice of the input frequency, a change in the output signal to the input signal of the harmonic mixer 1 becomes 1:2. That is, the on/off ratio of the switching circuit including the added BRF 17 and the attenuator 20 becomes ideally twice the on/off ratio at the harmonic mixer output terminal, and is added with the on/off ratio of the harmonic mixer per se, thereby making it possible to improve the on/off ratio of the entire pulse modulation circuit.

As described above, in this embodiment, in the pulse modulation circuit using the harmonic mixer 1 that mixes the second harmonic wave of the LO signal that is the local oscillation wave and the DC pulse signal together and outputs the RF pulse signal, the switching circuit (switch) that is made up of the two SPDT switches 15 and 16 is connected in series to the fore stage of the harmonic mixer 1. That is, in the switching circuit, one of between the SPDT switches 15 and 16 is connected directly and the other is connected through the BRF 17 and the attenuator 20. In this structure, the switching circuit and the harmonic mixer 1 are allowed to conduct the switching operation at the same time according to the DC pulse signal, thereby improving the on/off operation. Also, since the output frequency of the harmonic mixer 1 is twice of the input frequency, a change of the output signal to the input signal of the harmonic mixer 1 is 1:2. That is, the on/off ratio of the switching circuit including the added attenuator 20 becomes ideally twice the on/off ratio at the harmonic output terminal, and is then added with the on/off ratio of the harmonic mixer 1 per se, thereby making it possible to improve the on/off ratio of the entire pulse modulation circuit.

Sixth Embodiment

Figure 6:
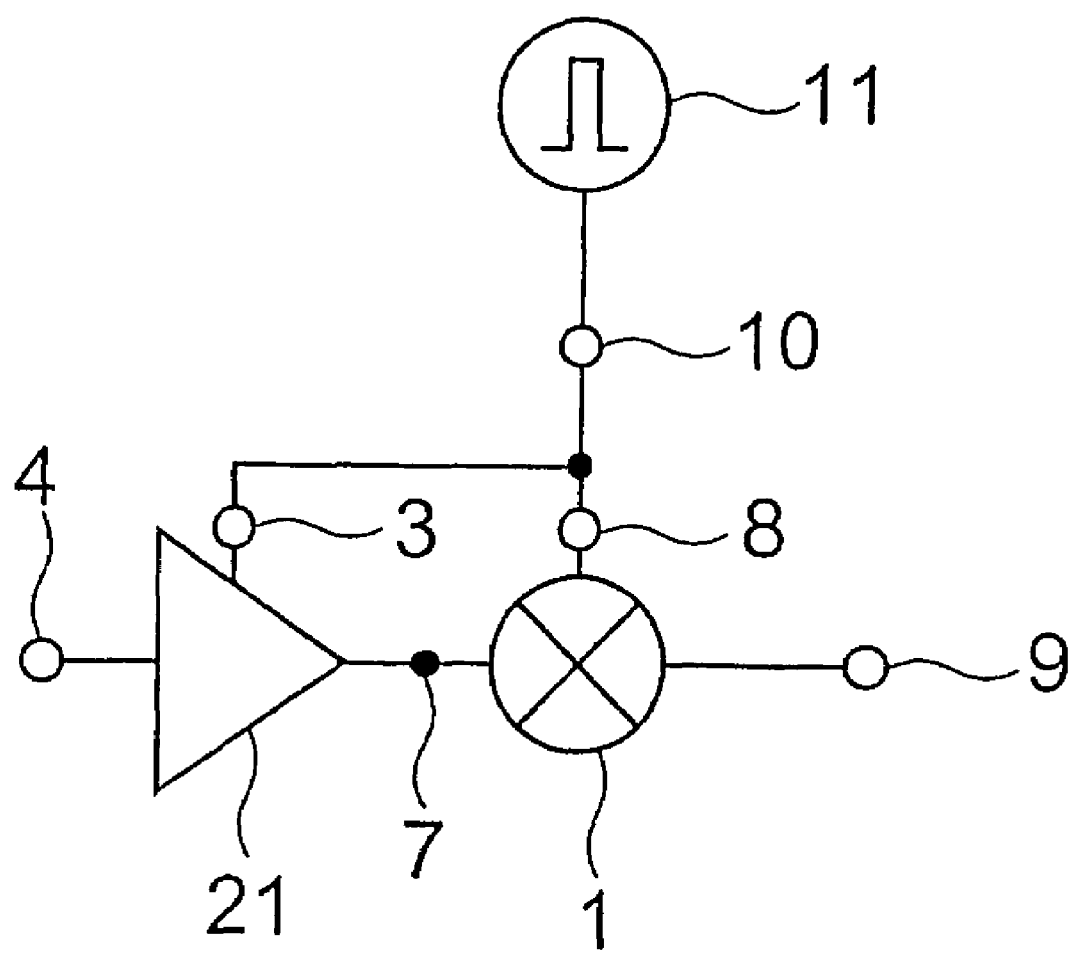
FIG. 6 is a structural diagram showing the structure of a pulse modulation circuit in accordance with a sixth embodiment of the present invention.

FIG. 6 shows the structure of a pulse modulation circuit in accordance with a sixth embodiment of the present invention. As shown in FIG. 6, the pulse modulation circuit according to this embodiment is made up of a harmonic mixer 1, a switch pulse input terminal 3, an LO signal input terminal 4, a harmonic mixer LO signal input terminal 7, a harmonic mixer IF signal input terminal 8, an RF signal output terminal 9, a pulse signal supply terminal 10, a pulse signal generator 11, and an attenuator 20.

The structure of FIG. 6 is a structure in which the SPST switch 2 of the above first embodiment is replaced with the attenuator 21. Because the basic structure and operation are identical with those of the first embodiment, the detailed description will be omitted while the same parts are indicated by symbols identical with those in FIG. 1.

In this embodiment, the on/off ratio of the attenuator 21 is determined according to the gain at the pulse-on time and the isolation at the pulse-off time of the attenuator 21. As in the first embodiment, since the output frequency of the harmonic mixer 1 is twice of the input frequency, a change in the output signal to the input signal of the harmonic mixer 1 becomes 1:2. That is, the on/off ratio of the added attenuator 21 becomes ideally twice the on/off ratio at the harmonic mixer output terminal, and is added with the on/off ratio of the harmonic mixer per se, thereby making it possible to improve the on/off ratio of the entire pulse modulation circuit.

As described above, in this embodiment, in the pulse modulation circuit using the harmonic mixer 1 that inputs the LO signal that is the local oscillation wave and the DC pulse signal, mixes the second harmonic wave of the LO signal and the DC pulse signal together, and outputs the RF pulse signal, the attenuator 21 is connected in series to the fore stage of the harmonic mixer 1 and conducts the switching operation together with the harmonic mixer 1 according to the DC pulse signal, thereby improving the on/off operation. Also, since the output frequency of the harmonic mixer 1 is twice of the input frequency, a change of the output signal to the input signal of the harmonic mixer 1 is 1:2. That is, the on/off ratio of the added attenuator 21 becomes ideally twice the on/off ratio at the output terminal of the harmonic mixer 1, and is then added with the on/off ratio of the harmonic mixer 1 per se, thereby making it possible to improve the on/off ratio of the entire pulse modulation circuit.

What is claimed is:

1. A pulse modulation circuit that inputs a local oscillation wave and a DC pulse signal, mixes a second harmonic wave of the local oscillation wave with the DC pulse signal, and outputs an RF pulse signal, the pulse modulation circuit comprising:
   a switch that inputs the local oscillation wave and attenuates the local oscillation wave at an off time more than at an on time; and
   a harmonic mixer that inputs the local oscillation wave affected by the switch and the DC pulse signal, mixes the second harmonic wave of the local oscillation wave with the DC pulse signal, and outputs the RF pulse signal, wherein the switch is allowed to conduct a switching operation together with the harmonic mixer according to the DC pulse signal.

2. The pulse modulation circuit according to claim 1, wherein the switch is connected in series to the harmonic mixer.

3. The pulse modulation circuit according to claim 1, wherein the switch is connected in parallel with the harmonic mixer.

4. The pulse modulation circuit according to claim 1, wherein the switch comprises an SPST switch.

5. The pulse modulation circuit according to claim 1, wherein the switch comprises an amplifier that enables switching operation.

6. The pulse modulation circuit according to claim 5, wherein the amplifier is connected in series with the harmonic mixer.

7. The pulse modulation circuit according to claim 1, wherein the switch comprises an attenuator that enables switching operation and is connected in series with the harmonic mixer.

8. The pulse modulation circuit according to claim 1, wherein the switch receives two input signals.

9. The pulse modulation circuit according to claim 1, wherein a first input signal received by a switch is a local oscillation wave signal and a second input signal is a pulse signal.

10. The pulse modulation circuit according to claim 9, further comprising a pulse generator which provides the pulse signal to both, the switch and to the harmonic mixer.

11. The pulse modulation circuit according to claim 1, wherein the switch receives two input signals together.

12. The pulse modulation circuit according to claim 1, wherein the switch comprises two input terminals, which receive two different input signals.

13. A pulse modulation circuit that inputs a local oscillation wave and a DC pulse signal, mixes a second harmonic wave of the local oscillation wave with the DC pulse signal, and outputs an RF pulse signal, the pulse modulation circuit comprising:
    a switch that inputs the local oscillation wave and attenuates the local oscillation wave at an off time more than at an on time; and
    a harmonic mixer that inputs the local oscillation wave affected by the switch and the DC pulse signal, mixes the second harmonic wave of the local oscillation wave with the DC pulse signal, and outputs the RF pulse signal,
    wherein the switch is allowed to conduct a switching operation together with the harmonic mixer according to the DC pulse signal, and
    wherein the switch comprises a first SPDT switch with one input and two outputs, and a second SPDT switch with two inputs and one output, and
    wherein one output terminal of the first SPDT switch is connected directly to one input terminal of the second SPDT switch, and
    wherein the other output terminal of the first SPDT switch and the other input terminal of the second SPDT switch are connected to each other through attenuation means for attenuating the local oscillation wave.

14. The pulse modulation circuit according to claim 13, wherein the attenuation means comprises a band rejection filter having a local oscillation frequency as a resonance frequency.

15. The pulse modulation circuit according to claim 13, wherein the attenuation means comprises a fixed attenuator.

16. The pulse modulation circuit according to claim 13, wherein the attenuation means comprises a band rejection filter having a local oscillation frequency as a resonance frequency, and a fixed attenuator that is connected in series to the band rejection filter.

* * * * *